United States Patent
Wang et al.

(10) Patent No.: US 12,179,470 B2
(45) Date of Patent: Dec. 31, 2024

(54) LAMINATED STRUCTURE ASSEMBLY, WINDOW ASSEMBLY AND CONTROL METHOD

(71) Applicant: SAINT-GOBAIN GLASS FRANCE, Courbevoie (FR)

(72) Inventors: Lu Wang, Shanghai (CN); Siteng Ma, Shanghai (CN)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 17/919,457

(22) PCT Filed: Apr. 28, 2021

(86) PCT No.: PCT/CN2021/090381
§ 371 (c)(1),
(2) Date: Oct. 17, 2022

(87) PCT Pub. No.: WO2021/218980
PCT Pub. Date: Nov. 4, 2021

(65) Prior Publication Data
US 2023/0150238 A1    May 18, 2023

(30) Foreign Application Priority Data
Apr. 30, 2020   (CN) .......................... 202010364305.6

(51) Int. Cl.
*B32B 7/023*    (2019.01)
*B32B 7/12*    (2006.01)
(Continued)

(52) U.S. Cl.
CPC ................ *B32B 7/023* (2019.01); *B32B 7/12* (2013.01); *B32B 17/10036* (2013.01);
(Continued)

(58) Field of Classification Search
CPC ........... B32B 7/023; B32B 7/12; B32B 37/10; B32B 37/06
(Continued)

(56) References Cited

U.S. PATENT DOCUMENTS 11,141,950 B1 * 10/2021 Kingman ................. B32B 7/12
2007/0199591 A1 * 8/2007 Harder ................. H01L 31/056
257/E31.13
(Continued)

FOREIGN PATENT DOCUMENTS

CN          105156933 A        12/2015
CN          105291789 A        2/2016
(Continued)

OTHER PUBLICATIONS

Machine_English_translation_CN_109118974_A; Guo, M; Photovoltaic display curtain wall assembly and a photovoltaic display curtain wall system; Jan. 1, 2019; EPO; whole document (Year: 2023).*

(Continued)

*Primary Examiner* — Tahseen Khan
(74) *Attorney, Agent, or Firm* — Pillsbury Winthrop Shaw Pittman LLP

(57) ABSTRACT

A laminated structure assembly includes, between an upper transparent substrate and a lower transparent substrate, different combinations of a photovoltaic layer, a light-adjusting layer and a light-emitting layer that are stacked in sequence from top to bottom, and bonding layers are provided to bond adjacent layers. There is also provided a window assembly that includes the laminated structure assembly and a controller electrically connected to the laminated structure assembly. There is also provided a method for adjusting a window assembly, a computer device for control and a computer-readable medium. The laminated structure assem- (Continued)

bly provides a combination of a plurality of functions, thereby meets requirements of users.

24 Claims, 9 Drawing Sheets

(51) Int. Cl.
  *B32B 17/10* (2006.01)
  *B32B 27/08* (2006.01)
  *B32B 37/06* (2006.01)
  *B32B 37/10* (2006.01)

(52) U.S. Cl.
  CPC .. *B32B 17/10504* (2013.01); *B32B 17/10633* (2013.01); *B32B 27/08* (2013.01); *B32B 37/06* (2013.01); *B32B 37/10* (2013.01); *B32B 2250/05* (2013.01); *B32B 2307/412* (2013.01); *B32B 2307/584* (2013.01); *B32B 2457/202* (2013.01)

(58) Field of Classification Search
  USPC .......................................................... 428/49
  See application file for complete search history.

(56) References Cited

U.S. PATENT DOCUMENTS

| | | | |
|---|---|---|---|
| 2014/0054578 A1* | 2/2014 | Thoumazet | G02B 1/116 257/40 |
| 2014/0178618 A1* | 6/2014 | Tanabe | G06F 1/1601 428/38 |
| 2015/0206503 A1 | 7/2015 | Chen et al. | |
| 2015/0276194 A1* | 10/2015 | Lowenthal | H01L 25/0753 362/231 |
| 2016/0129945 A1 | 5/2016 | Deppe | |
| 2016/0276501 A1* | 9/2016 | Wassvik | H01L 31/055 |
| 2020/0396840 A1* | 12/2020 | Grandia | B32B 27/08 |
| 2021/0237398 A1* | 8/2021 | Asao | G02B 5/12 |

FOREIGN PATENT DOCUMENTS

| | | | | |
|---|---|---|---|---|
| CN | 206892491 U | | 1/2018 | |
| CN | 109118974 A | * | 1/2019 | ............... E04B 2/88 |

OTHER PUBLICATIONS

International Search Report as issued in International Patent Application No. PCT/CN2021/090381, dated Jul. 29, 2021.

* cited by examiner

900

| 902 |
| 904 |
| 906 |
| 908 |
| 922 |
| 910 |
| 912 |
| 914 |
| 920 |
| 916 |
| 918 |

| 1002 |
| 1004 |
| 1006 |
| 1008 |
| 1022 |
| 1010 |
| 1012 |
| 1014 |
| 1020 |
| 1016 |
| 1024 |
| 1018 |

| 1502 |
| 1504 |
| 1508 |
| 1506 |
| 1510 |
| 1512 |
| 1514 |
| 1516 |
| 1524 |
| 1518 |

| 1602 |
| 1604 |
| 1608 |
| 1606 |
| 1610 |
| 1612 |
| 1614 |
| 1616 |
| 1618 |

FIG. 16

LAMINATED STRUCTURE ASSEMBLY, WINDOW ASSEMBLY AND CONTROL METHOD

CROSS-REFERENCE TO RELATED APPLICATIONS

This application is the U.S. National Stage of PCT/CN2021/090381, filed Apr. 28, 2021, which in turn claims priority to Chinese patent application number 202010364305.6 filed Apr. 30, 2020. The content of these applications are incorporated herein by reference in their entireties.

RELATED FIELD

The present disclosure relates to laminated glass, and in particular to a laminated structure of laminated glass with intermediate functional layers.

BACKGROUND

Laminated glass is a composite glass product formed by providing one or more layers of organic polymer intermediate film between two or more pieces of glass, and permanently bonding the glass and the intermediate film as a whole after subjecting a special high-temperature pre-laminating (or vacuuming) process and a high-temperature and high-pressure process.

Therefore, the laminated glass has a laminated structure, and a functional layer may be provided between two pieces of substrate glass to obtain a glass assembly with various functions.

SUMMARY

An object of the present disclosure is to provide a laminated glass structure with composite functions.

According to an aspect of the present disclosure, a laminated structure is provided, and comprises an upper-layer transparent substrate and a lower-layer transparent substrate, wherein a light-emitting layer, and a light-adjusting layer and/or a photovoltaic layer are stacked in sequence from bottom to top between the upper-layer transparent substrate and the lower-layer transparent substrate, and bonding layers are provided to bond adjacent layers. A light-emitting layer and a light-adjusting layer may be provided, or a light-emitting layer and a photovoltaic layer may be provided, or a light-emitting layer, a light-adjusting layer and a photovoltaic layer may be provided.

The upper-layer transparent substrate and the lower-layer transparent substrate are preferably glasses.

Optionally, the upper surface of the upper-layer transparent substrate is further provided with a reflection-reducing layer, an anti-fouling layer and/or an anti-scratch layer, and these layers may be directly coated on the upper surface of the upper-layer transparent substrate.

The photovoltaic layer may be a thin-film photovoltaic layer. The thin-film photovoltaic layer may have light-transmitting holes so as to transmit sunlight, or the thin-film photovoltaic layer itself may transmit light.

Alternatively, the photovoltaic layer may be a photovoltaic structure of single crystal or polycrystal semiconductor material. The photovoltaic layer comprises at least one photovoltaic module of semiconductor material, which is light-tight. The photovoltaic layer may cover part of the area of the laminated structure assembly so that sunlight can pass through.

In case that the laminated structure assembly does not comprise a light-adjusting layer, that is, only a photovoltaic layer and a light-emitting layer are provided between the upper-layer transparent substrate and the lower-layer transparent substrate, the photovoltaic layer may cover all or part of the area of the laminated structure, thereby shielding all or part of the light.

Optionally, a first infrared-reducing layer is provided on the light-adjusting layer. The first infrared-reducing layer is configured as a film with a base of PET or other materials. In this case, the lower side of the first infrared-reducing layer is bonded to the light-adjusting layer through the bonding layer.

In case that the laminated structure comprises the photovoltaic layer, the first infrared-reducing layer is provided between the photovoltaic layer and the light-adjusting layer, and the upper side of the first infrared-reducing layer is bonded to the photovoltaic layer through the bonding layer.

Alternatively, in case that the laminated structure does not comprise a photovoltaic layer, the first infrared-reducing layer may be provided between the upper-layer transparent substrate and the light-adjusting layer, and may be configured as an infrared-reducing material coating coated on the lower surface of the upper-layer transparent substrate, or may be configured as a film with a base and bonded to the upper-layer transparent substrate and the light-adjusting layer through the bonding layer.

The light-emitting layer may be a passive light-emitting layer, and configured as a light-guiding coating coated on the surface of the adjacent bonding layer. The light-guiding coating may be configured to have an integral form or configured to be composed of a plurality of portions.

Alternatively, the light-emitting layer may be an active light-emitting layer configured as a transparent discrete LEDs-array structure layer or an electro-luminescent layer. The light-emitting layer is configured to have an integral form or is configured to be composed of a plurality of independently controllable portions.

Optionally, a second infrared-reducing layer is provided between the lower-layer transparent substrate and the light-emitting layer.

The second infrared-reducing layer may be an infrared-reducing material coating directly coated on the upper surface of the lower-layer transparent substrate, alternatively, the second infrared-reducing layer may be a film with a base of PET or other materials. In this case, the second infrared-reducing layer is bonded to the lower-layer transparent substrate through the bonding layer.

The light-adjusting layer is configured to have an integral form or is configured to be composed of a plurality of independently controllable portions.

In some cases, the photovoltaic layer, the light-adjusting layer, the light-emitting layer, the first infrared-reducing layer, or the second infrared-reducing layer cannot completely occupy the entire area of the laminated structure, resulting in a gap between adjacent layers. Therefore, the layer which is incompletely filled is provided with thermoplastic filling material.

According to another aspect of the present disclosure, a window assembly is provided, and comprises said laminated structure assembly and a controller, the laminated structure assembly being electrically connected to the controller, wherein the controller is configured to provide power generated by the photovoltaic layer and/or external input power to the light-adjusting layer and/or the light-emitting layer according to power required by the light-adjusting layer and/or the light-emitting layer.

Moreover, the window assembly further comprises an external storage device, wherein the controller is configured to determine whether the power generated by the photovoltaic layer is greater than the power required by the light-adjusting layer and/or the light-emitting layer, and if the result of determination is yes, then to provide part of power to the external storage device.

The light-adjusting layer and/or the light-emitting layer are composed of a plurality of independently controllable portions, and the controller is further configured to respectively provide power to the plurality of independently controllable portions of the light-adjusting layer and/or the light-emitting layer. Moreover, the controller is further configured to provide variable power to the light-adjusting layer and/or the light-emitting layer.

The light-emitting layer is a passive light-emitting layer, the window assembly comprises a light source provided at the periphery of the passive light-emitting layer, and the controller is further configured to control the light source.

According to another aspect of the present disclosure, a window assembly is provided, and comprises said laminated structure assembly and at least one interface configured to be electrically connected to a controller, wherein the controller is configured to provide power generated by the photovoltaic layer and/or external input power to the light-adjusting layer and/or the light-emitting layer according to power required by the light-adjusting layer and/or the light-emitting layer.

According to another aspect of the present disclosure, a method for adjusting light-adjusting and/or light-emitting power of a window assembly comprising an optional photovoltaic layer, an optional light-adjusting layer and a light-emitting layer is provided, and comprises: obtaining power; and one or more of the followings:
  providing a first power to the light-adjusting layer;
  providing a second power to the light-emitting layer.

The step of obtaining power comprises: obtaining power from the photovoltaic layer and/or obtaining power from external. For example, when the power generated by the photovoltaic layer is insufficient, that is, the photovoltaic layer cannot generate sufficient power for the light-adjusting layer and/or the light-emitting layer to use, additional power can be further obtained from external.

The light-adjusting layer is composed of a plurality of independently controllable portions, and the method further comprises one or more of the followings:
  respectively providing the first power to the plurality of independently controllable portions of the light-adjusting layer;
  variably providing the first power to the plurality of independently controllable portions of the light-adjusting layer.

The light-emitting layer is composed of a plurality of independently controllable portions, and the method further comprises one or more of the followings:
  respectively providing the second power to the plurality of independently controllable portions of the light-emitting layer;
  variably providing the second power to the plurality of independently controllable portions of the light-emitting layer.

According to another aspect of the present disclosure, a computer device is provided, and comprises a memory, a processor, and instructions stored in the memory and executable by the processor, wherein the processor implements steps of the method for adjusting light-adjusting and/or light-emitting power of a window assembly when executing the instructions.

According to another aspect of the present disclosure, a computer-readable medium on which executable instructions are stored is provided, wherein the executable instructions are configured to cause a machine to implement steps of the method for adjusting light-adjusting and/or light-emitting power of a window assembly when executed.

The laminated structure of the present disclosure can provide a combination of a plurality of functions, and can provide various light and shadow effects, thereby meeting requirements of users.

BRIEF DESCRIPTION OF THE DRAWINGS

FIGS. 1-16 are respectively schematic views of embodiments 1-16 of the present disclosure.

DETAILED DESCRIPTION

Figure 1:
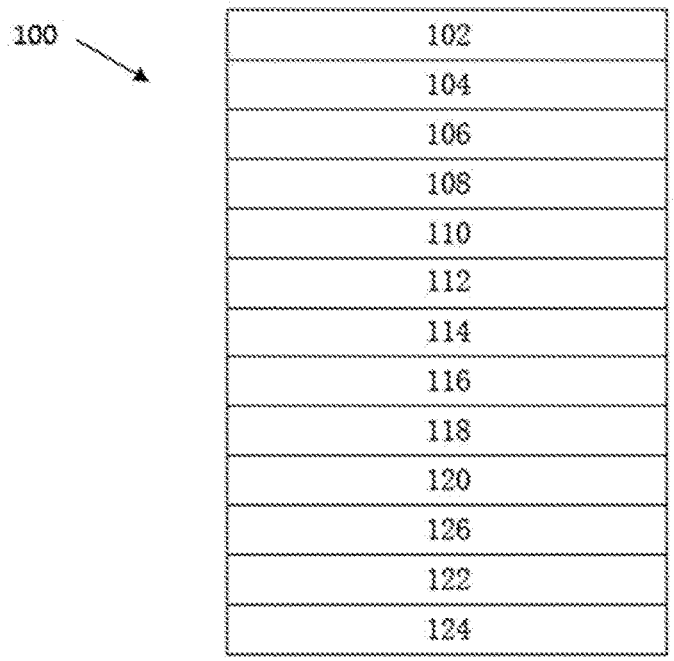

A plurality of embodiments of the present disclosure is described below with reference to the drawings.

FIGS. 1-16 respectively show various possible particular configurations of the laminated structural assembly of the present disclosure.

In the description of the present disclosure, the terms "upper" and "lower" refer to the vertical orientations in the drawings of the specification. The term "transverse" refers to the horizontal direction in the drawings of the specification. The term "width" refers to the dimension in the horizontal direction in the drawings of the specification. The term "area" refers to the surface area in the horizontal direction in the drawings of the specification.

In addition, in the present disclosure, the terms "first", "second" and similar terms are merely used to distinguish the same technical terms for the ease of description, and do not imply or hint any sequence or orientation. In addition, in different embodiments, exemplary solutions, or described structures, even the same terms do not necessarily indicate that the structures are certainly the same.

According to the present disclosure, a laminated structure assembly is provided, and comprises an optional reflection-reducing layer/anti-fouling layer/anti-scratch layer, an upper-layer transparent substrate, an optional photovoltaic layer, an optional first infrared-reducing layer, an optional light-adjusting layer, a light-emitting layer, an optional second infrared-reducing layer and a lower glass, wherein adjacent layers are bonded to each other through a bonding layer.

An embodiment of the present disclosure may comprise a combination of the photovoltaic layer, the light-adjusting layer, and the light-emitting layer. Another embodiment of the present disclosure may comprise a combination of the photovoltaic layer and the light-emitting layer. Alternatively, another embodiment of the present disclosure comprises a combination of the light-adjusting layer and the light-emitting layer.

The upper-layer transparent substrate and the lower-layer transparent substrate are preferably glasses. The upper glass is preferably a glass with a high light transmittance, so as to transmit more light. The lower glass is preferably a glass with a low light transmittance, so as to provide a relatively soft lighting environment. Alternatively, those skilled in the art can understand that the upper-layer and lower-layer transparent substrates may be made of other transparent materials.

The reflection-reducing layer/anti-fouling layer/anti-scratch layer may be directly coated on the upper surface of the upper glass. The reflection-reducing layer, the anti-fouling layer, and the anti-scratch layer may be coatings independent of each other, for example, the reflection-reducing layer, the anti-fouling layer, or the anti-scratch layer coated on the upper surface of the upper glass. Alternatively, the reflection-reducing layer/anti-fouling layer/anti-scratch layer may be a coating that integrates at least two functions of reflection-reducing, anti-fouling, and anti-scratch, which can be determined as required in different embodiments. For example, in the combination of the light-adjusting layer and the light-emitting layer, the reflection-reducing layer may be left out, or a composite coating that has the reflection-reducing function may not be provided.

Figure 17:
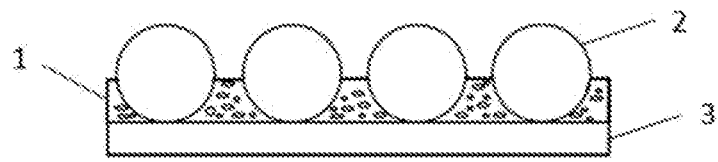
FIG. 17 is a schematic view of a reflection-reducing/anti-fouling layer adapted to the present disclosure.

FIG. 17 shows a structure of the reflection-reducing layer, which further has an anti-fouling function. The reflection-reducing layer shown in FIG. 17 comprises a porous layer 1 provided on the upper surface of a glass substrate 3 and a plurality of particles 2 provided in the porous layer. The porous layer 1 is made of a pore-forming polymer, which is selected from PMMA, nitrocellulose, cellulose acetate butyrate or polyvinyl alcohol. The particles 2 are made of silicon dioxide, titanium dioxide, aluminum oxide or zirconium oxide. The reflection-reducing layer shown in FIG. 17 is commercially available from Saint-Gobain Glass.

Figure 18:
FIG. 18 is a schematic view of an anti-fouling/anti-scratch layer adapted to the present disclosure.

FIG. 18 shows a structure of the anti-fouling layer, which further has an anti-scratch function. The anti-fouling layer shown in FIG. 18 comprises a framework layer 5 provided on the upper surface of a glass substrate 4 which has a plurality of openings 6. The framework layer 5 is made of silicon oxide, aluminum oxide or titanium oxide. The openings 6 can be formed by arranging sacrificial particles in the framework layer. The sacrificial particles can be made of high molecular polymers, such as polymethyl methacrylate or polystyrene. The anti-fouling layer shown in FIG. 18 is commercially available from Saint-Gobain Glass.

The photovoltaic layer may be a thin-film photovoltaic layer. The thin-film photovoltaic layer has light-transmitting holes so as to allow light to pass through the thin-film photovoltaic layer. The arrangement pattern of these light-transmitting holes can be set as required. Alternatively, the thin-film photovoltaic layer itself may transmit light. An example of the thin-film photovoltaic layer comprises, but is not limited to, a thin-film solar cell based on amorphous silicon, cadmium telluride, copper indium tin, or copper indium gallium selenide.

Alternatively, the photovoltaic layer may be a photovoltaic module based on single crystal or polycrystal semiconductor material. The photovoltaic layer in the present disclosure comprises at least one single crystal or polycrystal semiconductor photovoltaic module. An example of the photovoltaic module comprises, but is not limited to, a photovoltaic module based on single crystal silicon, polycrystal silicon, gallium arsenide, indium gallium phosphide, or indium phosphide. The single crystal silicon photovoltaic module is preferable.

The semiconductor material photovoltaic module is generally configured as a light-tight sheet-shaped module. In order to transmit light, the photovoltaic layer is configured to cover part of the area of the laminated structure assembly, for example, the photovoltaic layer may cover the middle part or the edge part, or may be configured as an array of a plurality of modules discretely distributed.

Both the first and second infrared-reducing layers may be film-based infrared-reducing layers configured to have a base of PET or other materials and an infrared-reducing material coating provided on the base. For example, products such as the XIR or UCSF series may be available from Saint-Gobain Safety Glass. The side surface with the coating may be arranged to face upward, alternatively, the side surface with the coating may be arranged to face downward.

Alternatively, the first and second infrared-reducing layers may just be infrared-reducing material coatings. For example, products such as the KAPPA series, CoolCoat and ClimaCoat are available from Saint-Gobain Safety Glass.

The light-adjusting layer is generally configured to have a structure with an upper base and a lower base, so that the bases of the light-adjusting layer are respectively bonded to the adjacent bonding layers. For example, the light-adjusting layer may be a layer having an electrochromic structure, a suspended particle device, a polymer dispersed liquid crystal structure, or a guest-host liquid crystal structure, or any combination thereof. The light-adjusting layer may be configured to have an integral form, that is, to have an integral structure and to be controlled as a whole. Alternatively, the light-adjusting layer can be divided into a plurality of light-adjusting modules, and each light-adjusting module can be independently controlled. Particular structures of the light-adjusting modules may be the same or different.

The light-emitting layer may be an active light-emitting layer generally configured to have an upper base and a lower base, so that the two bases may be respectively bonded to the adjacent bonding layers.

The active light-emitting layer may have a form of a transparent discrete LEDs-array structure layer in which a plurality of LED light-emitting units is provided. The arrangement of these LED light-emitting units may be determined as required. For example, these LED light-emitting units may be arranged to a particular pattern as required. These LED light-emitting units are configured to be controllable as a whole, or configured to be independently controllable for each light-emitting unit, or configured as a plurality of groups, wherein each group is independently controllable. The LED light-emitting units may be configured to emit light of different colors, or each LED light-emitting unit may emit light of various colors.

Alternatively, the active light-emitting layer may have another form of an electro-luminescent structure layer having a plurality of sub-layers, such as a fluorescent layer, a dielectric layer, and a transparent conductive layer. The light-emitting layer may be configured as an electro-luminescent layer having an integral form, that is, the light-emitting layer is a whole and is controlled as a whole. Alternatively, the light-emitting layer is configured to comprise a plurality of separate electro-luminescent structure modules so that each module can be independently controlled.

The light-emitting layer may be a passive light-emitting layer being a light-guiding coating directly coated on the surface of the adjacent bonding layer. The light-guiding coating does not completely cover the surface of the bonding layer, so that the surface of the bonding layer provided with the light-guiding coating may still play a role of bonding. Preferably, the light-guiding coating is provided on the lower surface of the adjacent bonding layer.

Generally, the light-guiding coating is configured to transmit light from an external light source. In the present disclosure, the light-guiding coating may be configured to transmit light from a plurality of light sources, or transmit light of different colors. The light-guiding coating may be configured to have an integral form or configured to be composed of a plurality of portions. In addition, the passive light-emitting layer may be arranged in a required layout, for example, in a particular shape or the like. The integral light-guiding coating has an integral structure, and may transmit light from a plurality of different light sources. The light-guiding coating composed of a plurality of portions may transmit light separately.

In addition, the area of each layer between the upper-layer transparent substrate and the lower-layer transparent substrate is generally small, and therefore, gaps may be formed at the edge portions of each of the intermediate layers. For example, the width and/or length of the light-adjusting layer, the light-emitting layer or the film-based infrared-reducing layer is smaller than those of the upper and lower glasses, so that gaps are formed at the edge portions. Thermoplastic filling material, such as PVB, may be arranged in the formed gaps, so as to keep the dimensions consistent and play a role of sealing the edges. In addition, the unoccupied portion of the crystalline silicon module in the photovoltaic layer may also be filled with thermoplastic material, such as PVB.

In addition, PVB material is preferably used for each bonding layer, and EVA, TPO or POE may be used as well. PVB can isolate ultraviolet rays. Preferably, the PVB material used in the present disclosure can isolate ultraviolet rays of the range of 10-400 nm.

Various particular configurations of the laminated structure assembly of the present disclosure will be described hereinafter in detail with reference to the accompanying drawings. In the following embodiments, unless otherwise specified, each layer may use the particular structure as described above.

FIGS. 1-4 show the first group of embodiments, corresponding to Embodiments 1-4 respectively. In the embodiments of the first group, the laminated structure assemblies each comprise a reflection-reducing layer/anti-fouling layer/anti-scratch layer, an upper glass, a photovoltaic layer, a first infrared-reducing layer, a light-adjusting layer, a light-emitting layer, a second infrared-reducing layer and a lower glass arranged from top to bottom.

The photovoltaic layer is bonded to the upper glass. The first infrared-reducing layer is bonded to the photovoltaic layer. In Embodiments 1-4, the first infrared-reducing layer is a film-based infrared-reducing layer. The light-adjusting layer is bonded to the first infrared-reducing layer. The light-emitting layer is bonded to the light-adjusting layer. In Embodiments 1-4, the particular configurations of the light-emitting layer and the second infrared-reducing layer are variable.

In the following description of Embodiments 1-4, only the particular configurations of the light-emitting layer and the second infrared-reducing layer, and the particular configurations of the laminated structure assemblies obtained therefrom are described. The structures and materials of the other layers not specifically described may be the same or may be selected in the same range.

Embodiment 1

As shown in FIG. 1, a laminated structure assembly 100 comprises a reflection-reducing layer/anti-fouling layer/anti-scratch layer 102, an upper glass 104, a first bonding layer 106, a photovoltaic layer 108, a second bonding layer 110, a PET-based infrared-reducing layer 112, a fifth bonding layer 114, a light-adjusting layer 116, a third bonding layer 118, an active light-emitting layer 120, a fourth bonding layer 126, an infrared-reducing material coating 122 and a lower glass 124 stacked from top to bottom.

In this embodiment, the light-emitting layer is the active light-emitting layer 120, the upper side of which is bonded to the light-adjusting layer 116 through the third bonding layer 118, and the lower side of which is bonded to the fourth bonding layer 126.

In this embodiment, the second infrared-reducing layer is the infrared-reducing material coating 122 coated on the upper surface of the lower glass 124 and bonded to the lower surface of the fourth bonding layer 126 together with the lower glass 124.

Embodiment 2

Figure 2:
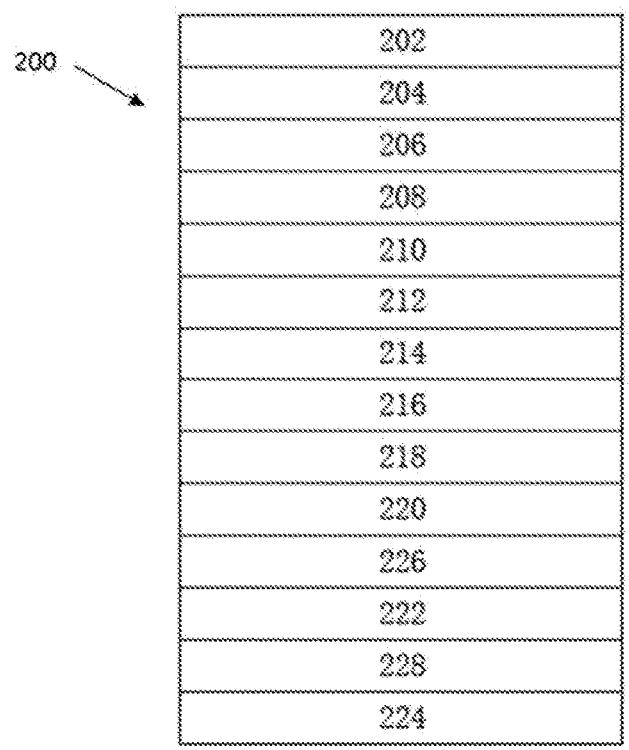

As shown in FIG. 2, a laminated structure assembly 200 comprises a reflection-reducing layer/anti-fouling layer/anti-scratch layer 202, an upper glass 204, a first bonding layer 206, a photovoltaic layer 208, a second bonding layer 210, a PET-based infrared-reducing layer 212, a fifth bonding layer 214, a light-adjusting layer 216, a third bonding layer 218, an active light-emitting layer 220, a fourth bonding layer 226, a PET-based infrared-reducing layer 222, a sixth boding layer 228 and a lower glass 224 stacked from top to bottom.

In this embodiment, the light-emitting layer is the active light-emitting layer 220, the upper side of which is bonded to the light-adjusting layer 216 through the third bonding layer 218, and the lower side of which is bonded to the fourth bonding layer 226.

In this embodiment, the second infrared-reducing layer is the PET-based infrared-reducing layer 222, the upper side of which is bonded to the fourth bonding layer 226, and the lower side of which is bonded to the lower glass 224 through the sixth bonding layer 228.

Embodiment 3

Figure 3:
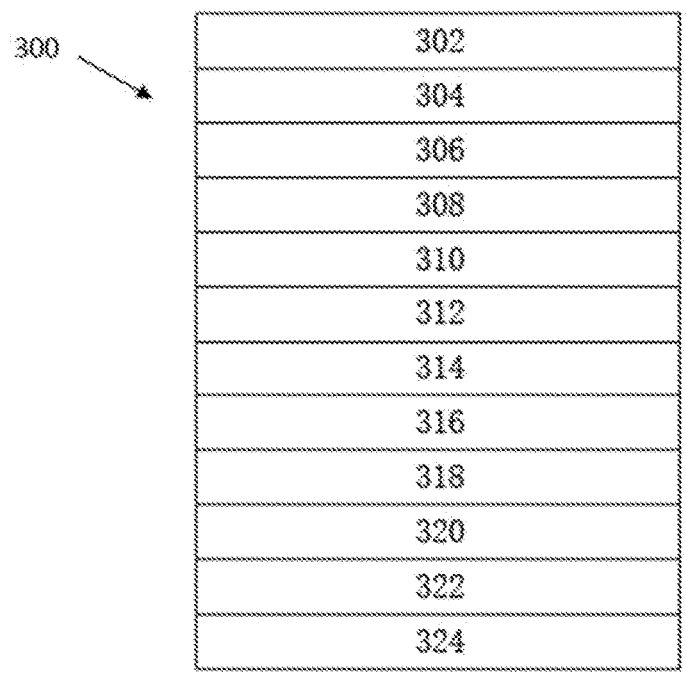

FIG. 3 shows a laminated structure assembly 300 comprising a reflection-reducing layer/anti-fouling layer/anti-scratch layer 302, an upper glass 304, a first bonding layer 306, a photovoltaic layer 308, a second bonding layer 310, a PET-based infrared-reducing layer 312, a fifth bonding layer 314, a light-adjusting layer 316, a third bonding layer 318, a passive light-emitting layer 320, an infrared-reducing material coating 322 and a lower glass 324 stacked from top to bottom.

In this embodiment, the light-emitting layer is the passive light-emitting layer 320, which may be a light-guiding coating directly coated on the third bonding layer 318 located on the upper side of the light-emitting layer. In this embodiment, the light-guiding coating is provided on the lower surface of the third bonding layer 318.

In this embodiment, the second infrared-reducing layer is the infrared-reducing material coating 322 coated on the upper surface of the lower glass 324 bonded to the lower surface of the third bonding layer 318 together with the lower glass 324.

Embodiment 4

Figure 4:
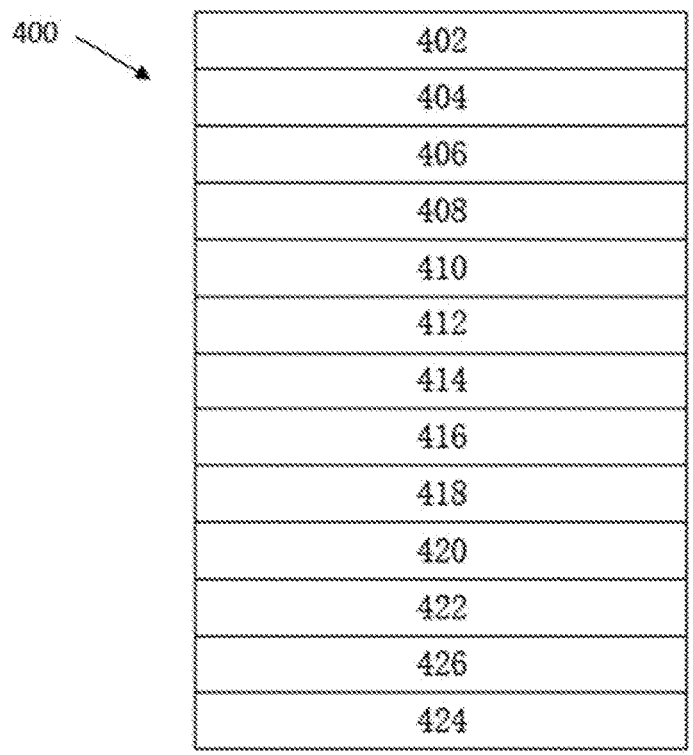

As shown in FIG. 4, a laminated structure assembly 400 comprises a reflection-reducing layer/anti-fouling layer/anti-scratch layer 402, an upper glass 404, a first bonding layer 406, a photovoltaic layer 408, a second bonding layer 410, a PET-based infrared-reducing layer 412, a fifth bonding layer 414, a light-adjusting layer 416, a third bonding layer 418, a passive light-emitting layer 420, a PET-based infrared-reducing layer 422, a sixth boding layer 428 and a lower glass 424 stacked from top to bottom.

In this embodiment, the light-emitting layer is the passive light-emitting layer 420, which may be a light-guiding coating directly coated on the lower surface of the third bonding layer 418 located on the upper side of the light-emitting layer.

In this embodiment, the second infrared-reducing layer is the PET-based infrared-reducing layer 422, the upper side of which is bonded to the third bonding layer 418, and the lower side of which is bonded to the lower glass 424 through the sixth bonding layer 428.

FIGS. 5-8 show the second group of embodiments, corresponding to Embodiments 5-8 respectively. In the embodiments of the second group, the laminated structure assemblies each comprise a reflection-reducing layer/anti-fouling layer/anti-scratch layer, an upper glass, a photovoltaic layer, a light-emitting layer, an infrared-reducing layer and a lower glass arranged from top to bottom.

The photovoltaic layer is bonded to the upper glass. The light-emitting layer is bonded to the photovoltaic layer. In Embodiments 5-8, the infrared-reducing layer may be considered to correspond to the second infrared-reducing layer. In addition, the particular configurations of the light-emitting layer and the infrared-reducing layer are variable.

In the following description of Embodiments 5-8, only the particular configurations of the light-emitting layer and the infrared-reducing layer, and the particular configurations of the laminated structure assemblies obtained therefrom are described. The structures and materials of the other layers not specifically described may be the same or may be selected in the same range.

Embodiment 5

Figure 5:
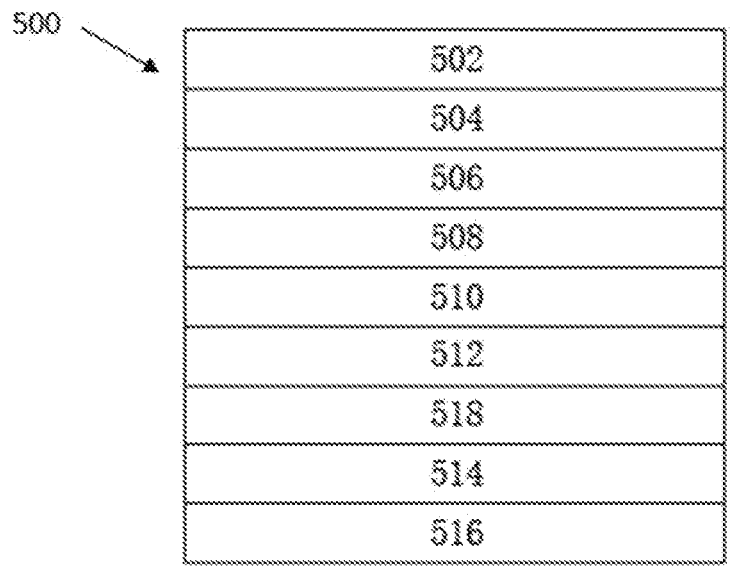

As shown in FIG. 5, a laminated structure assembly 500 comprises a reflection-reducing layer/anti-fouling layer/anti-scratch layer 502, an upper glass 504, a first bonding layer 506, a photovoltaic layer 508, a second bonding layer 510, an active light-emitting layer 512, a third bonding layer 518, an infrared-reducing material coating 514 and a lower glass 516 stacked from top to bottom.

In this embodiment, the light-emitting layer is the active light-emitting layer 512, the upper side of which is bonded to the photovoltaic layer 508 through the second bonding layer 510, and the lower side of which is bonded to the third bonding layer 518.

In this embodiment, the infrared-reducing layer is the infrared-reducing material coating 514 directly coated on the upper surface of the lower glass 516 and bonded to the lower surface of the third bonding layer 518 together with the lower glass 516.

Embodiment 6

Figure 6:
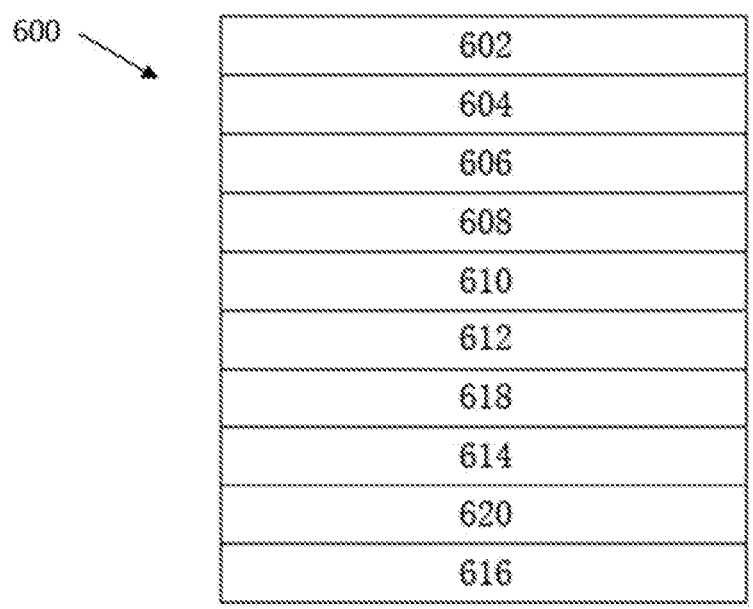

As shown in FIG. 6, a laminated structure assembly 600 comprises a reflection-reducing layer/anti-fouling layer/anti-scratch layer 602, an upper glass 604, a first bonding layer 606, a photovoltaic layer 608, a second bonding layer 610, an active light-emitting layer 612, a third bonding layer 618, a PET-based infrared-reducing layer 614, a fourth bonding layer 620, and a lower glass 616 stacked from top to bottom.

In this embodiment, the light-emitting layer is the active light-emitting layer 612, the upper side of which is bonded to the photovoltaic layer 608 through the second bonding layer 610, and the lower side of which is bonded to the infrared-reducing layer through the third bonding layer 618.

In this embodiment, the infrared-reducing layer is the PET-based infrared-reducing layer 614 bonded to the lower glass 616 through the fourth bonding layer 620.

Embodiment 7

Figure 7:
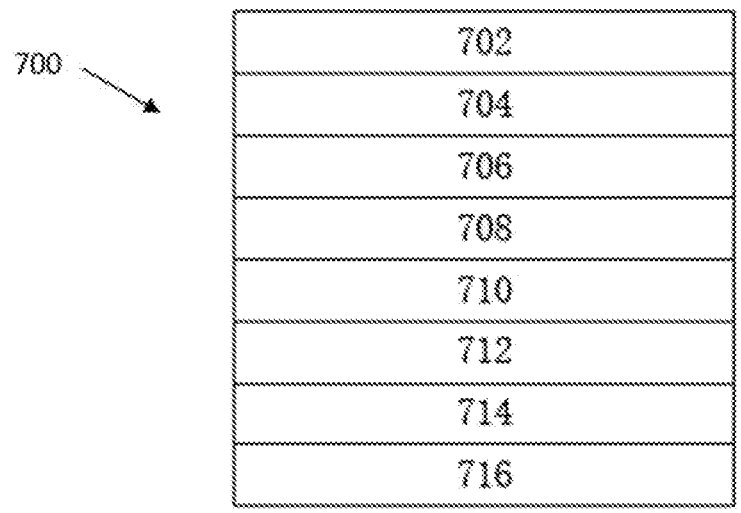

As shown in FIG. 7, a laminated structure assembly 700 comprises a reflection-reducing layer/anti-fouling layer/anti-scratch layer 702, an upper glass 704, a first bonding layer 706, a photovoltaic layer 708, a second bonding layer 710, a passive light-emitting layer 712, an infrared-reducing material coating 714 and a lower glass 716 stacked from top to bottom.

In this embodiment, the light-emitting layer is the passive light-emitting layer 712, which may be a light-guiding coating directly coated on the lower surface of the second bonding layer 710 located on the upper side of the light-emitting layer.

In this embodiment, the infrared-reducing layer is the infrared-reducing material coating 714 directly coated on the upper surface of the lower glass 716 and bonded to the lower surface of the second bonding layer 710 together with the lower glass 716.

Embodiment 8

Figure 8:
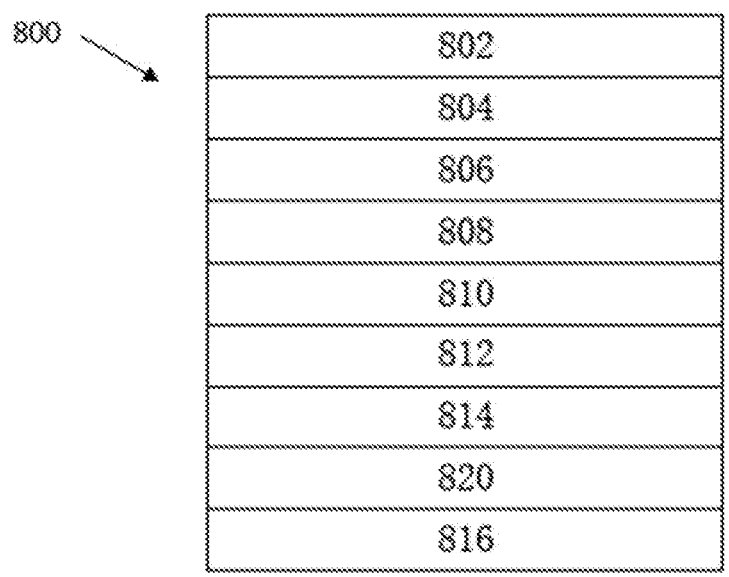

As shown in FIG. 8, a laminated structure assembly 800 comprises a reflection-reducing layer/anti-fouling layer/anti-scratch layer 802, an upper glass 804, a first bonding layer 806, a photovoltaic layer 808, a second bonding layer 810, a passive light-emitting layer 812, a PET-based infrared-reducing layer 814, a fourth bonding layer 820, and a lower glass 816 stacked from top to bottom.

In this embodiment, the light-emitting layer is the passive light-emitting layer 812, which may be a light-guiding coating directly coated on the lower surface of the second bonding layer 810 located on the upper side of the light-emitting layer.

In this embodiment, the infrared-reducing layer is the PET-based infrared-reducing layer 814, the upper side of which is bonded to the second bonding layer 810, and the lower side of which is bonded to the lower glass 816 through the fourth bonding layer 820.

FIGS. 9-16 show the third group of embodiments, corresponding to Embodiments 9-16 respectively. In the embodiments of the third group, the laminated structure assemblies each comprise an anti-fouling layer/anti-scratch layer, an upper glass, a first infrared-reducing layer, a light-adjusting layer, a light-emitting layer, a second infrared-reducing layer and a lower glass stacked from top to bottom, and bonding layers are provided to bond adjacent layers.

In the following description of Embodiments 9-16, only the particular configurations of the light-emitting layer and the first and second infrared-reducing layers, and the particular configurations of the laminated structure assemblies obtained therefrom are described. The structures and materials of the other layers not specifically described may be the same or may be selected in the same range.

Embodiment 9

As shown in FIG. 9, a laminated structure assembly 900 comprises an anti-fouling layer/anti-scratch layer 902, an upper glass 904, a first bonding layer 906, a PET-based infrared-reducing layer 908, a fourth bonding layer 922, a light-adjusting layer 910, a second bonding layer 912, an active light-emitting layer 914, a third bonding layer 920, an infrared-reducing material coating 916 and a lower glass 918 stacked from top to bottom.

In this embodiment, the first infrared-reducing layer is the PET-based infrared-reducing layer 908 bonded to the upper glass 904 through the first bonding layer 906 and bonded to the light-adjusting layer 910 through the fourth bonding layer 922.

In this embodiment, the light-emitting layer is the active light-emitting layer 914, the upper side of which is bonded to the light-adjusting layer 910 through the second bonding layer 912, and the lower side of which is bonded to the third bonding layer 920.

The second infrared-reducing layer is configured as the infrared-reducing material coating 916 directly coated on the upper surface of the lower glass 918 and bonded to the lower surface of the third bonding layer 920 together with the lower glass 918.

Embodiment 10

As shown in FIG. 10, a laminated structure assembly 1000 comprises an anti-fouling layer/anti-scratch layer 1002, an upper glass 1004, a first bonding layer 1006, a PET-based infrared-reducing layer 1008, a fourth bonding layer 1022, a light-adjusting layer 1010, a second bonding layer 1012, an active light-emitting layer 1014, a third bonding layer 1020, a PET-based infrared-reducing layer 1016, a fifth bonding layer 1024, and a lower glass 1018 stacked from top to bottom.

In this embodiment, the first infrared-reducing layer is the PET-based infrared-reducing layer 1008, the upper side of which is bonded to the upper glass 1004 through the first bonding layer 1006, and the lower side of which is bonded to the light-adjusting layer 1010 through the fourth bonding layer 1022.

In this embodiment, the light-emitting layer is the active light-emitting layer 1014, the upper side of which is bonded to the light-adjusting layer 1010 through the second bonding layer 1012, and the lower side of which is bonded to the second infrared-reducing layer through the third bonding layer 1020.

In this embodiment, the second infrared-reducing layer is the PET-based infrared-reducing layer 1016, the lower side of which is bonded to the lower glass 1018 through the fifth bonding layer 1024.

Embodiment 11

Figure 11:
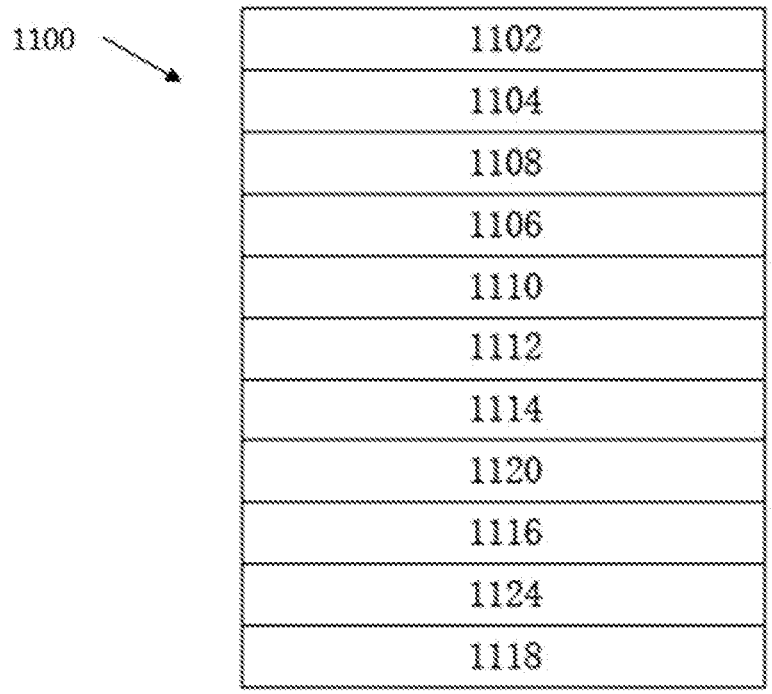

As shown in FIG. 11, in this embodiment, a laminated structure assembly 1100 comprises an anti-fouling layer/anti-scratch layer 1102, an upper glass 1104, an infrared-reducing material coating 1108, a first bonding layer 1106, a light-adjusting layer 1110, a second bonding layer 1112, an active light-emitting layer 1114, a third bonding layer 1120, a PET-based infrared-reducing layer 1116, a fifth bonding layer 1124, and a lower glass 1118 stacked from top to bottom.

In this embodiment, the first infrared-reducing layer is the infrared-reducing material coating 1108 directly coated on the lower surface of the upper glass 1104 and bonded to the upper surface of the first bonding layer 1106 together with the upper glass 1104.

In this embodiment, the light-emitting layer is the active light-emitting layer 1114, the upper side of which is bonded to the light-adjusting layer 1110 through the second bonding layer 1112, and the lower side of which is bonded to the second infrared-reducing layer through the third bonding layer 1120.

In this embodiment, the second infrared-reducing layer is the PET-based infrared-reducing layer 1118, the lower side of which is bonded to the lower glass 1118 through the fifth bonding layer 1124.

Embodiment 12

Figure 12:
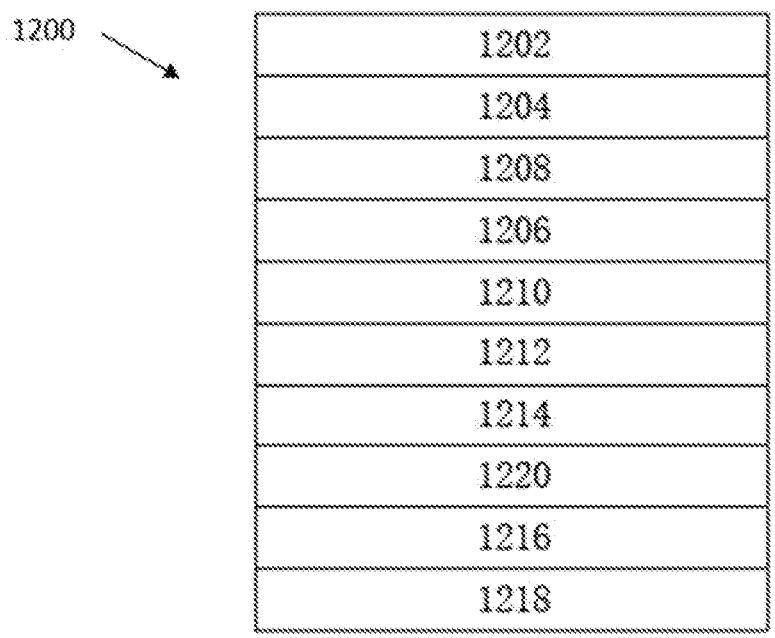

As shown in FIG. 12, a laminated structure assembly 1200 comprises an anti-fouling layer/anti-scratch layer 1202, an upper glass 1204, an infrared-reducing material coating 1208, a first bonding layer 1206, a light-adjusting layer 1210, a second bonding layer 1212, an active light-emitting layer 1214, a third bonding layer 1220, an infrared-reducing material coating 1216 and a lower glass 1218.

In this embodiment, the first infrared-reducing layer is the infrared-reducing material coating 1208 directly coated on the lower surface of the upper glass 1204 and bonded to the upper surface of the first bonding layer 1206 together with the upper glass 1204.

In this embodiment, the light-emitting layer is the active light-emitting layer 1214, the upper side of which is bonded to the light-adjusting layer 1210 through the second bonding layer 1212, and the lower side of which is bonded to the third bonding layer 1220.

In this embodiment, the second infrared-reducing layer is the infrared-reducing material coating 1216 directly coated on the upper surface of the lower glass 1218 and bonded to the lower surface of the third bonding layer 1220 together with the lower glass 1218.

Embodiment 13

Figure 13:
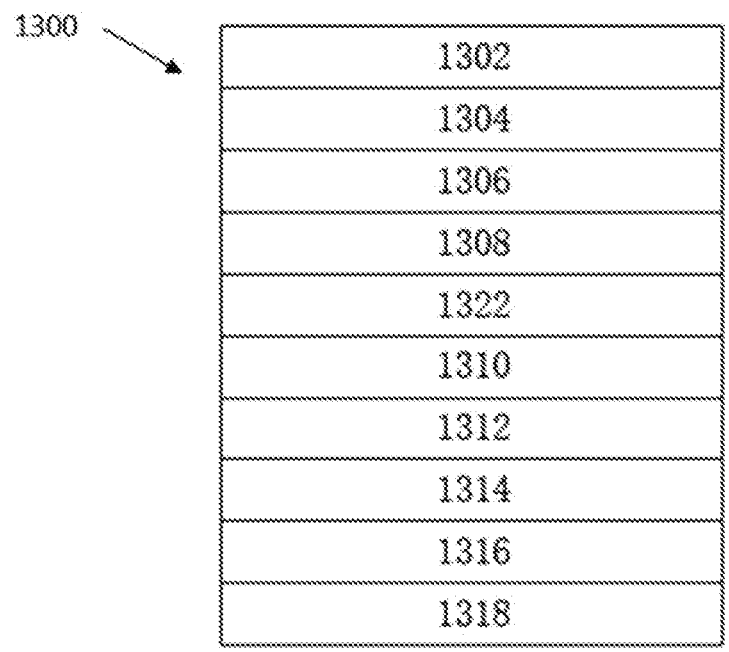

As shown in FIG. 13, a laminated structure assembly 1300 comprises an anti-fouling layer/anti-scratch layer 1302, an upper glass 1304, a first bonding layer 1306, a PET-based infrared-reducing layer 1308, a fourth bonding layer 1322, a light-adjusting layer 1310, a second bonding layer 1312, a passive light-emitting layer 1314, an infrared-reducing material coating 1316 and a lower glass 1318.

In this embodiment, the first infrared-reducing layer is the PET-based infrared-reducing layer 1308, the upper side of which is bonded to the upper glass 1304 through the first bonding layer 1306 and the lower side of which is bonded to the light-adjusting layer 1310 through the fourth bonding layer 1322.

In this embodiment, the light-emitting layer is the passive light-emitting layer 1314, which may be a light-guiding coating directly coated on the lower surface of the second bonding layer 1312 located on the upper side of the light-emitting layer.

In this embodiment, the second infrared-reducing layer is the infrared-reducing material coating 1316 directly coated on the upper surface of the lower glass 1318 and bonded to the lower surface of the second bonding layer 1312 together with the lower glass 1318.

Embodiment 14

Figure 14:
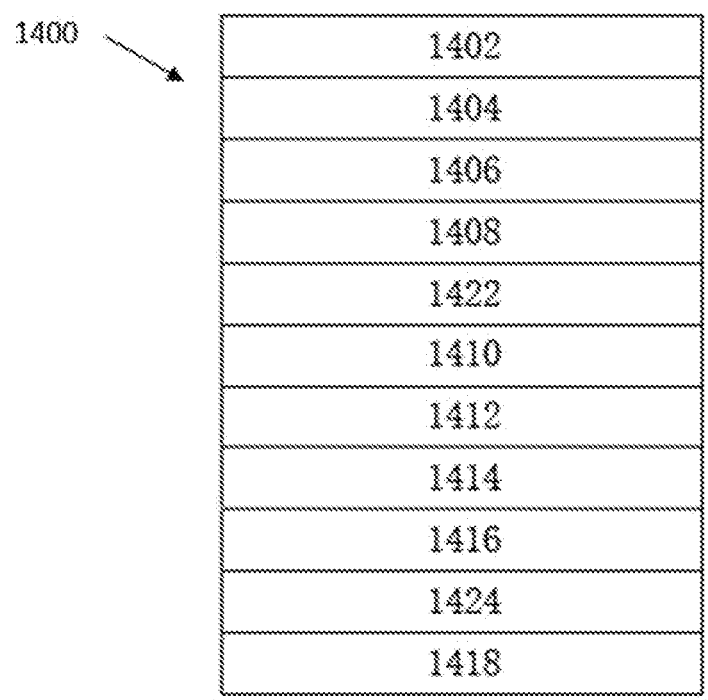

As shown in FIG. 14, a laminated structure assembly 1400 comprises an anti-fouling layer/anti-scratch layer 1402, an upper glass 1404, a first bonding layer 1406, a PET-based infrared-reducing layer 1408, a fourth bonding layer 1422, a light-adjusting layer 1410, a second bonding layer 1412, a passive light-emitting layer 1414, a PET-based infrared-reducing layer 1416, a fifth bonding layer 1424, and a lower glass 1418.

In this embodiment, the first infrared-reducing layer is the PET-based infrared-reducing layer 1408, the upper side of which is bonded to the upper glass 1404 through the first bonding layer 1406 and the lower side of which is bonded to the light-adjusting layer 1410 through the fourth bonding layer 1422.

In this embodiment, the light-emitting layer is the passive light-emitting layer 1414 being a light-guiding coating directly coated on the lower surface of the second bonding layer 1412 located on the upper side of the light-emitting layer.

In this embodiment, the second infrared-reducing layer is the PET-based infrared-reducing layer 1416, the upper side of which is bonded to the second bonding layer 1412, and the lower side of which is bonded to the lower glass 1418 through the fifth bonding layer 1424.

Embodiment 15

As shown in FIG. 15, a laminated structure assembly 1500 comprises an anti-fouling layer/anti-scratch layer 1502, an upper glass 1504, an infrared-reducing material coating 1508, a first bonding layer 1506, a light-adjusting layer 1510, a second bonding layer 1512, a passive light-emitting layer 1514, a PET-based infrared-reducing layer 1516, a fifth bonding layer 1524, and a lower glass 1518.

In this embodiment, the first infrared-reducing layer is the infrared-reducing material coating 1508 directly coated on the lower surface of the upper glass 1504 and bonded to the upper surface of the first bonding layer 1506 together with the upper glass 1504.

In this embodiment, the light-emitting layer is the passive light-emitting layer 1514, which may be a light-guiding coating directly coated on the lower surface of the second bonding layer 1512 located on the upper side of the light-emitting layer.

In this embodiment, the second infrared-reducing layer is the PET-based infrared-reducing layer 1516, the upper side of which is bonded to the second bonding layer 1512, and the lower side of which is bonded to the lower glass 1518 through the fifth bonding layer 1524.

Embodiment 16

As shown in FIG. 16, a laminated structure assembly 1600 comprises an anti-fouling layer/anti-scratch layer 1602, an upper glass 1604, an infrared-reducing material coating 1608, a first bonding layer 1606, a light-adjusting layer 1610, a second bonding layer 1612, a passive light-emitting layer 1614, an infrared-reducing material coating 1616, and a lower glass 1618.

In this embodiment, the first infrared-reducing layer is the infrared-reducing material coating 1608 directly coated on the lower surface of the upper glass 1604 and bonded to the first bonding layer 1606 together with the upper glass 1604.

In this embodiment, the light-emitting layer is the passive light-emitting layer 1614, which may be a light-guiding coating directly coated on the lower surface of the second bonding layer 1612 located on the upper side of the light-emitting layer.

In this embodiment, the second infrared-reducing layer is the infrared-reducing material coating 1616 coated on the upper surface of the lower glass 1618 and bonded to the lower surface of the second bonding layer 1612 together with the lower glass 1618.

In the present disclosure, the combination of the photovoltaic layer, the light-adjusting layer and the light-emitting layer can provide different light and shadow modes and effects as required.

For example, the photovoltaic layer shields part of sunlight, and the light passing therethrough forms a pattern according to the arrangement of the photovoltaic layer. For example, the light-transmitting holes of the thin-film photovoltaic layer may be arranged in a circle, a rectangle or other patterns. The shape of the light-transmitting hole is not limited to a circle, and may be various regular or irregular polygons. For another example, in the crystalline silicon photovoltaic layer, the crystalline silicon photovoltaic modules are arranged in the middle, and the light passes through the edge portion; or the crystalline silicon photovoltaic modules are arranged at the edge portion, and the light passes through the middle portion; or the crystalline silicon photovoltaic modules are arranged in an array, and the light passing therethrough presents a grid pattern.

The light-adjusting layer can adjust the brightness of light, and achieve overall or partial brightness and/or color changes by controlling all or part of the light-adjusting layer, thereby obtaining various light and shadow effects. For example, an electrochromic light-adjusting layer can adjust the brightness of the light, and a liquid crystal light-adjusting layer can adjust the brightness and color of the light.

The active light-emitting layer can be controlled to cooperate with the light passing through the photovoltaic layer and/or the light-adjusting layer to provide different light and shadow effects. For example, a portion shielded by the photovoltaic layer is configured to emit light to supplement the light intensity; or the light-transmitting portion of the corresponding photovoltaic layer is configured to emit light to enhance the contrast of brightness and darkness; or in a background environment darkened by the adjustment of the light-adjusting layer, part of the photovoltaic layer emits light to achieve particular effects, for example, the starry sky effect.

The passive light-emitting layer may be configured to guide light transmitted from the photovoltaic layer and produce a required lighting effect. For example, the light-guiding coating may be configured to guide the light transmitted from the edge portion to the middle portion, or transmit the light transmitted from the middle portion to the edge portion, so as to achieve a more uniform lighting effect. For another example, the light-guiding coating may be configured into various patterns as required, so as to form a lighting effect with a pattern.

The passive light-emitting layer can further transmit additional light emitted by an external light source, such as LED light sources arranged around the light-guiding coating. These LED light sources can be controlled to achieve different lighting effects.

The laminated structure of the present disclosure can thus achieve the coordination of functionality with optical and visual effects.

According to a further embodiment of the present disclosure, a window assembly is provided, and comprises the laminated structure assembly according to any one of the embodiments 1-16 and at least one interface configured to be electrically connected to a controller, wherein the controller is configured to provide power generated by the photovoltaic layer and/or external input power to the light-adjusting layer and/or the light-emitting layer according to power required by the light-adjusting layer and/or the light-emitting layer.

According to a further embodiment of the present disclosure, a window assembly is provided, and comprises the laminated structure assembly according to any one of the embodiments 1-16 and a controller, wherein the layers of the laminated structure assembly are electrically connected to the controller, and wherein the controller is configured to provide power generated by the photovoltaic layer and/or external input power to the light-adjusting layer and/or the light-emitting layer according to power required by the light-adjusting layer and/or the light-emitting layer.

The controller is configured to provide power generated by the photovoltaic layer or input power from an external storage device to the light-adjusting layer and/or the light-emitting layer according to power required by the light-adjusting layer and/or the light-emitting layer. That is, when the power generated by the photovoltaic layer meets requirements of the light-adjusting layer and/or the light-emitting layer, only the power generated by the photovoltaic layer is provided, while when the power generated by the photovoltaic layer cannot meet requirements of the light-adjusting layer and/or the light-emitting layer, the power generated by the photovoltaic layer and the additional power obtained from the external storage device are both provided to the light-adjusting layer and/or the light-emitting layer. The controller is further configured to provide the surplus power generated by the photovoltaic layer to the external storage device when the power generated by the photovoltaic layer cannot be completely consumed by the light-adjusting layer and/or the light emitting layer.

As mentioned above, the light-adjusting layer and/or the light-emitting layer may be composed of a plurality of independently controllable portions, and the controller is further configured to respectively provide power to the plurality of independently controllable portions of the light-adjusting layer and/or the light-emitting layer.

For example, the power may be provided to all of independently controllable portions of the light-adjusting layer, so that the entire light-adjusting layer operates. Alternatively, the power is only provided to part instead of all of the independently controllable portions of the light-adjusting layer, so that part of the light-adjusting layer operates.

For example, the power may be provided to all of independently controllable portions of the light-emitting layer, so that the entire light-emitting layer operates, that is, all of the light-emitting units emit light. Alternatively, the power is only provided to part instead of all of the independently controllable portions of the light-emitting layer, so that part of the light-emitting layer operates, that is, only part of the light-emitting units emits light, and the other part of the light-emitting units does not emit light.

The controller is further configured to provide variable power to the light-adjusting layer and/or the light-emitting layer. In an example, uniformly variable power is provided to the entire light-adjusting layer, so as to realize the change of overall light brightness. Alternatively, in another example, individually variable powers are respectively provided to the independently controllable portions of the light-adjusting layer, so as to achieve a different distribution of the light brightness.

Similarly, variable power may be provided to the entire light-emitting layer, so as to realize the change of overall light. Alternatively, variable power is respectively provided to the independently controllable portions of the light-emitting layer, so as to achieve a different distribution of the light brightness.

In an example, the light-emitting layer in the window assembly may be a passive light-emitting layer, and may further comprise a light source provided at the periphery of the passive light-emitting layer, and the controller is further configured to control said peripheral light source to obtain a required lighting effect. For example, the required lighting effect can be obtained by turning on/off part of the light sources or controlling the luminance of the light sources. The passive light-emitting layer can guide the light emitted by the light sources.

The function of the controller may be realized by a hardware circuit, or by a combination of a hardware circuit and executable instructions. For example, the controller may comprise a combination of a micro control unit and a memory, and the micro control unit executed the executable instructions in the memory and controls an execution element to realize the function of the controller. The controller may be configured as other devices capable of executing controlling instructions, such as a programmable gate circuit, a microcomputer, and the like.

Alternatively, the controller may be implemented as a hardware circuit. For example, the power generated by the photovoltaic layer and the power from the external storage device can be adjusted by an insulated gate bipolar transistor, and according to an electric signal sent by an external sensor, the power provided to the light-adjusting layer and/or the light-emitting layer is controlled by a switching element such as a relay or other adjusting elements. The electrical elements in the controller can be obtained from commercial sources.

Figure 19:
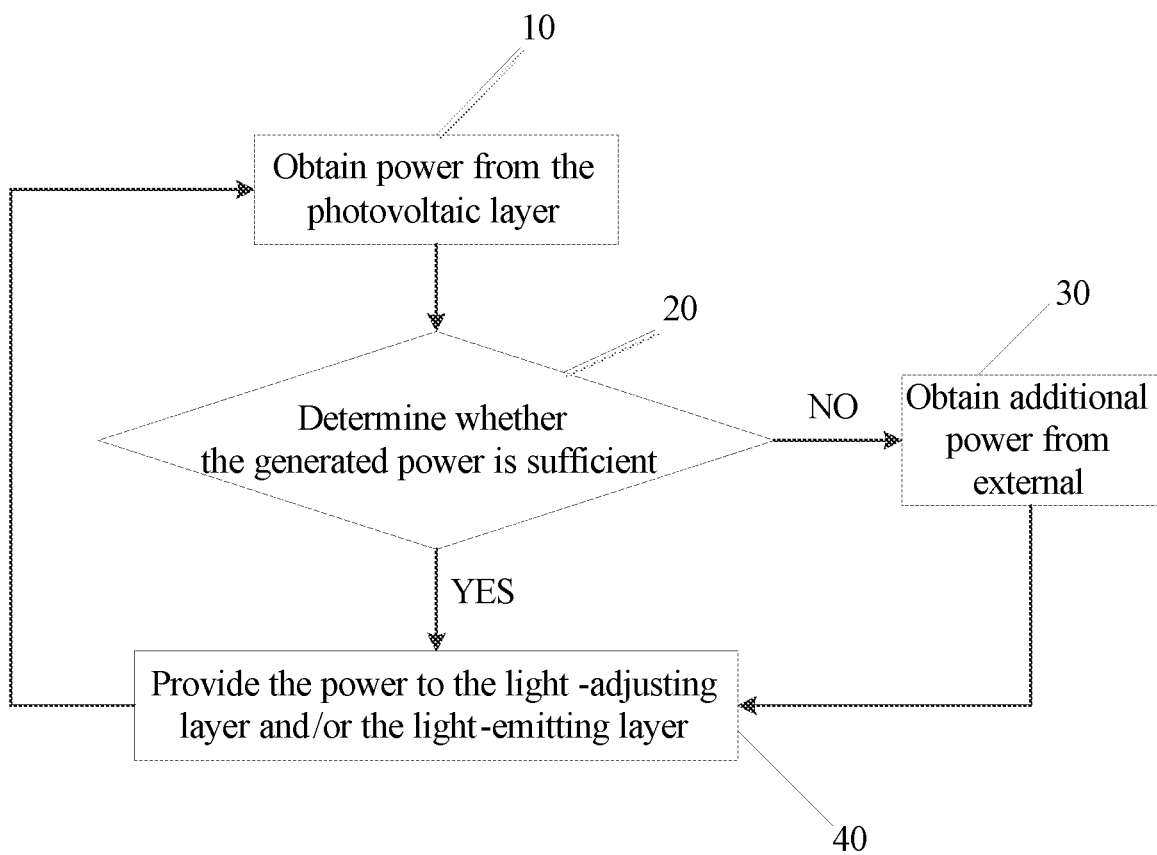
FIG. 19 is a schematic flow chart of the method of the present disclosure.

Referring to FIG. 19, according to another embodiment of the present disclosure, a method for adjusting light-adjusting and/or light-emitting power of a window assembly is further provided. The window assembly may be a laminated structure comprising an optional photovoltaic layer, an optional light-adjusting layer and a light-emitting layer according to any one of the embodiments 1-16.

The method comprises: step 10, obtaining power from the photovoltaic layer; step 20, determining whether the power generated by the photovoltaic layer is sufficient, and providing the power to the light-adjusting layer and/or the light-emitting layer if the power is sufficient; step 30, obtaining additional power from external if the power is insufficient; and step 40, providing the obtained power to the light-adjusting layer and/or the light-emitting layer.

The step of providing the obtained power to the light-adjusting layer and/or the light-emitting layer further comprises: providing a first power to the light-adjusting layer, and/or providing a second power to the light-emitting layer.

Further, the step of providing the first power to the light-adjusting layer comprises: respectively providing the first power to the plurality of independently controllable portions of the light-adjusting layer; and/or, variably providing the first power to the plurality of independently controllable portions of the light-adjusting layer.

Further, the step of providing the second power to the light-adjusting layer comprises: respectively providing the second power to the plurality of independently controllable portions of the light-emitting layer; and/or, variably providing the second power to the plurality of independently controllable portions of the light-emitting layer.

The method further comprises: providing the generated surplus power to the external storage device when the power generated by the photovoltaic layer is surplus.

It should be noted that there is no sequential restriction to the above steps of the method. For example, the power obtained from the photovoltaic layer may be directly allocated and sent to the light-adjusting layer and/or the light-emitting layer, and it is determined whether the power generated by the photovoltaic layer is sufficient when the power provided to the light-adjusting layer and/or the light-emitting layer needs to be increased. Alternatively, it is determined whether the power generated by the photovoltaic layer is sufficient before providing power to the light-adjusting layer and/or the light-emitting layer, for example, it is determined whether the rated power of the photovoltaic layer is less than the required power of the light-adjusting layer and/or the light-emitting layer, and then additional power is obtained from external, for example, from a battery or an external mains supply, before the power is allocated. Providing power to the light-adjusting layer and/or the light-emitting layer can be performed simultaneously or sequentially, depending on the particular application environment and the required light and shadow effects.

In another example of the method, the window assembly only comprises the light-adjusting layer and the light-emitting layer, the power can be obtained directly from external, and the other steps are the same as the previous example of the method.

According to another embodiment of the present disclosure, a computer device is provided, and comprises a memory, a processor, and instructions stored in the memory and executable by the processor, wherein the processor implements steps of the method for adjusting light-adjusting and/or light-emitting power of a window assembly when executing the instructions.

The computer device may be a device with computing capabilities such as a computer or a smart phone. For example, the computer device may be hardware, a dedicated circuit, software, a firmware, logic, or any combination thereof. In some embodiments, the memory may be a portable computer magnetic disk, a hard disk, a random access memory (RAM), a read-only memory (ROM), an erasable programmable read-only memory (EPROM or Flash memory), an optical storage device, a magnetic storage device, a cloud storage device, or any suitable combination thereof. The processor may be a general processor, a digital signal processor (DSP), an application specific integrated circuit (ASIC), a field programmable gate array (FPGA) or other programmable logic devices, a discrete gate or transistor logic device, a discrete hardware component, or any combination thereof. The general processor may be a microprocessor; alternatively, the processor may be any common processor, controller, microcontroller, or state machine. The processor may be implemented as a combination of a plurality of computer devices, for example, a combination of a DSP and a microprocessor, a combination of a plurality of microprocessors, a combination of one or more microprocessors and a DSP core, or any other similar structures.

According to another embodiment, a computer-readable medium on which executable instructions are stored is provided, wherein the executable instructions are configured to cause a machine to implement steps of the method for adjusting light-adjusting and/or light-emitting power of a window assembly when executed.

The computer-readable storage medium may be a tangible device capable of holding and storing instructions used by an instruction executing device. The computer-readable storage medium may be, but not limited to, for example, an electronic storage device, a magnetic storage device, an optical storage device, an electromagnetic storage device, a semiconductor storage device, or any suitable combination thereof. More particular examples (a non-exhaustive list) of the computer-readable storage medium comprise: a portable computer disk, a hard disk, a random access memory (RAM), a read-only memory (ROM), an erasable programmable read-only memory (EPROM or flash memory), a static random access memory (SRAM), a portable compact disk read-only memory (CD-ROM), a digital versatile disk (DVD), a memory stick, a floppy disk, a mechanical encoding device, such as a punch card or a protruding structure in a groove on which instructions are stored, and any suitable combination of thereof. The computer-readable storage medium used here is not interpreted as an instantaneous signal itself, such as radio wave or other freely propagating electromagnetic wave, electromagnetic wave propagating through waveguide or other transmission media (for example, light pulse travelling through optical fiber cables), or an electrical signal transmitting through wires.

The computer-readable program instructions described herein may be downloaded from the computer-readable storage medium to various computing/processing devices, or be downloaded to an external computer or an external storage device via a network, such as the Internet, a local area network, a wide area network, and/or a wireless network. The network may comprise copper transmission cables, optical fiber transmission, wireless transmission, a router, a firewall, an exchanger, a gateway computer, and/or an edge server. The network adapter card or network interface in each computing/processing device receives computer-readable program instructions from the network, and forwards the computer-readable program instructions to store the computer-readable program instructions in the computer-readable storage medium in each computing/processing device.

The computer program instructions for executing the operations of the present disclosure may be assembly instructions, instruction set architecture (ISA) instructions, machine instructions, machine-related instructions, microcode, firmware instructions, state setting data, or source code or object code written in any combination of one or more programming languages. The programming languages comprise object-oriented programming languages—such as Smalltalk, Python, C++, etc., and conventional procedure-oriented programming languages—such as "C" language or similar programming languages. The computer-readable program instructions may be completely executed on a user's computer, partially executed on a user's computer, executed as a stand-alone software package, partially executed on a user's computer and partially executed on a remote computer, or completely executed on a remote computer or server. In a case relating to a remote computer, the remote computer may be connected to the user's computer via any kind of network comprising the local area network (LAN) or the wide area network (WAN), or may be connected to an external computer (for example, via the Internet with the aid of an Internet service provider). In some embodiments, an electronic circuit, such as a programmable logic circuit, a field programmable gate array (FPGA), or a programmable logic array (PLA), is customized by using the status information of the computer-readable program instructions, and the electronic circuit can execute the computer-readable program instructions.

In the above description, the details of the technical solutions of the present disclosure have been described. However, it should be understood by those skilled in the art that the present disclosure is not limited to the particular details listed in the above embodiments, and can vary within the scope defined by the claims.

The invention claimed is:

1. A laminated structure assembly, comprising an upper-layer transparent substrate and a lower-layer transparent substrate, wherein a light-emitting layer and a light-adjusting layer and/or a photovoltaic layer are stacked in sequence from bottom to top between the upper-layer transparent substrate and the lower-layer transparent substrate, and bonding layers are provided to bond adjacent layers, wherein the photovoltaic layer is configured to comprise at least one single crystal or polycrystal semiconductor photovoltaic module, and wherein the photovoltaic layer is configured to cover part of the area of the laminated structure assembly, wherein the light-adjusting layer is a layer based on an electrochromic structure, a suspended particle device, a polymer dispersed liquid crystal structure, or a guest-host liquid crystal structure, or any combination thereof.

2. The laminated structure assembly according to claim 1, wherein the upper surface of the upper-layer transparent substrate is provided with a reflection-reducing layer, an anti-fouling layer and/or an anti-scratch layer.

3. The laminated structure assembly according to claim 1, wherein the photovoltaic layer is configured as a light-transmitting thin-film photovoltaic layer.

4. The laminated structure assembly according to claim 1, wherein a photovoltaic layer and a light-emitting layer are provided between the upper-layer transparent substrate and the lower-layer transparent substrate, and wherein the photovoltaic layer is configured to cover part or all of the area of the laminated structure assembly.

5. The laminated structure assembly according to claim 1, wherein a first infrared-reducing layer is provided on the light-adjusting layer, and wherein the first infrared-reducing layer is configured as a film with a base and is bonded to the light-adjusting layer.

6. The laminated structure assembly according to claim 1, wherein a light-adjusting layer and a light-emitting layer are provided between the upper-layer transparent substrate and the lower-layer transparent substrate, and wherein a first infrared-reducing layer is provided between the upper-layer transparent substrate and the light-adjusting layer, the first infrared-reducing layer being configured as an infrared-reducing material coating coated on the lower surface of the upper-layer transparent substrate, or the first infrared-reducing layer being configured as a film with a base and being bonded to the upper-layer transparent substrate and the light-adjusting layer.

7. The laminated structure assembly according to claim 1, wherein the light-emitting layer is configured as a light-guiding coating coated on the surface of the adjacent bonding layer, and wherein the light-guiding coating is configured to have an integral form or is configured to be composed of a plurality of portions.

8. The laminated structure assembly according to claim 1, wherein the light-emitting layer is configured as a transparent discrete LEDs-array structure layer or an electro-luminescent layer, and wherein the light-emitting layer is configured to have an integral form or is configured to be composed of a plurality of independently controllable portions.

9. The laminated structure assembly according to claim 1, wherein a second infrared-reducing layer is provided between the lower-layer transparent substrate and the light-emitting layer.

10. The laminated structure assembly according to claim 9, wherein the second infrared-reducing layer is configured as an infrared-reducing material coating coated on the upper surface of the lower-layer transparent substrate; or, the second infrared-reducing layer is configured as a film with a base and is bonded to the lower-layer transparent substrate.

11. The laminated structure assembly according to claim 9, wherein the light-adjusting layer is configured to have an integral form or is configured to be composed of a plurality of independently controllable portions.

12. The laminated structure assembly according to claim 1, wherein the light-emitting layer, the light-adjusting layer, the photovoltaic layer, the first infrared-reducing layer or the second infrared-reducing layer which is incompletely filled is provided with thermoplastic filling material.

13. A window assembly comprising the laminated structure assembly according to claim 1 and a controller, the laminated structure assembly being electrically connected to the controller, wherein the controller is configured to provide power generated by the photovoltaic layer and/or external input power to the light-adjusting layer and/or the light-emitting layer according to power required by the light-adjusting layer and/or the light-emitting layer.

14. The window assembly according to claim 13, wherein the window assembly further comprises an external storage device, and wherein the controller is further configured to determine whether the power generated by the photovoltaic layer is greater than the power required by the light-adjusting layer and/or the light-emitting layer, and when the controller determines that the power generated by the photovoltaic layer is greater than the power required by the light-adjusting layer and/or the light-emitting layer, then the controller is configured to provide part of power to the external storage device.

15. The window assembly according to claim 13, wherein the light-adjusting layer and/or the light-emitting layer are composed of a plurality of independently controllable portions, and wherein the controller is further configured to respectively provide power to the plurality of independently controllable portions of the light-adjusting layer and/or the light-emitting layer.

16. The window assembly according to claim 13, wherein the controller is further configured to provide variable power to the light-adjusting layer and/or the light-emitting layer.

17. The window assembly according to claim 13, wherein the light-emitting layer is a passive light-emitting layer and a light source provided at the periphery of the passive light-emitting layer, and wherein the controller is further configured to control the light source.

18. A window assembly comprising the laminated structure assembly according to claim 1 and at least one interface configured to be electrically connected to a controller, wherein the controller is configured to provide power generated by the photovoltaic layer and/or external input power to the light-adjusting layer and/or the light-emitting layer according to power required by the light-adjusting layer and/or the light-emitting layer.

19. A method for adjusting light-adjusting and/or light-emitting power of a window assembly comprising an optional photovoltaic layer, an optional light-adjusting layer and a light-emitting layer, wherein the light-emitting layer, the optional light-adjusting layer and the optional photovoltaic layer are stacked in sequence from bottom to top between an upper-layer transparent substrate and a lower-layer transparent substrate of a laminated structure assembly, and bonding layers are provided to bond adjacent layers, and wherein the method comprises: obtaining power; and any one or more of the followings:

providing a first power to the light-adjusting layer; providing a second power to the light-emitting layer, wherein the photovoltaic layer is configured to comprise at least one single crystal or polycrystal semiconductor photovoltaic module, wherein the photovoltaic layer is configured to cover part of the area of the laminated structure assembly, and wherein the light-adjusting layer is a layer based on an electrochromic structure, a suspended particle device, a polymer dispersed liquid crystal structure, or a guest-host liquid crystal structure, or any combination thereof.

20. The method for adjusting light-adjusting and/or light-emitting power of a window assembly according to claim 19, wherein obtaining power comprises: obtaining power from the photovoltaic layer and/or obtaining power from external.

21. The method for adjusting light-adjusting and/or light-emitting power of a window assembly according to claim 19, wherein the light-adjusting layer is composed of a plurality of independently controllable portions, and wherein the method further comprises one or more of the followings:
respectively providing the first power to the plurality of independently controllable portions of the light-adjusting layer;
variably providing the first power to the plurality of independently controllable portions of the light-adjusting layer.

22. The method for adjusting light-adjusting and/or light-emitting power of a window assembly according to claim 19, wherein the light-emitting layer is composed of a plurality of independently controllable portions, and wherein the method further comprises one or more of the followings:
respectively providing the second power to the plurality of independently controllable portions of the light-emitting layer;
variably providing the second power to the plurality of independently controllable portions of the light-emitting layer.

23. A computer device comprising a memory, a processor, and instructions stored in the memory and executable by the processor, wherein the processor implements steps of the method according to claim 19 when executing the instructions.

24. A non-transitory computer-readable medium on which executable instructions are stored, wherein the executable instructions are configured to cause a machine to implement steps of the method according to claim 19 when executed.

* * * * *